(12) United States Patent
Glassburn et al.

(10) Patent No.: US 9,280,200 B1
(45) Date of Patent: Mar. 8, 2016

(54) AUTOMATIC PEAK CURRENT THROTTLE OF TIERED STORAGE ELEMENTS

(71) Applicant: Western Digital Technologies, Inc., Irvine, CA (US)

(72) Inventors: Timothy R. Glassburn, San Jose, CA (US); Donald E. Adams, Pleasanton, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 374 days.

(21) Appl. No.: 13/898,288

(22) Filed: May 20, 2013

(51) Int. Cl.
*G06F 1/32* (2006.01)
*G11C 11/00* (2006.01)

(52) U.S. Cl.
CPC ............ *G06F 1/3268* (2013.01); *G06F 1/3221* (2013.01); *G06F 1/3225* (2013.01); *G11C 11/005* (2013.01)

(58) Field of Classification Search
CPC ... G06F 1/3206; G06F 1/3221; G06F 1/3225; G06F 1/3268; G11C 11/005
See application file for complete search history.

(56) References Cited

U.S. PATENT DOCUMENTS

| | | | |
|---|---|---|---|
| 5,345,347 A | 9/1994 | Hopkins et al. | |
| 5,452,277 A | 9/1995 | Bajorek et al. | |
| 5,638,541 A | 6/1997 | Sadashivaiah | |
| 6,367,023 B2 | 4/2002 | Kling et al. | |
| 6,608,729 B1 * | 8/2003 | Willems et al. | 360/69 |
| 6,725,385 B1 | 4/2004 | Chu et al. | |
| 6,856,556 B1 | 2/2005 | Hajeck | |
| 6,892,313 B1 | 5/2005 | Codilian et al. | |
| 6,928,559 B1 | 8/2005 | Beard | |
| 7,111,178 B2 | 9/2006 | Rusu et al. | |
| 7,126,857 B2 | 10/2006 | Hajeck | |
| 7,174,469 B2 | 2/2007 | Luick | |
| 7,352,641 B1 * | 4/2008 | Wu | 365/211 |
| 7,411,757 B2 | 8/2008 | Chu et al. | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,901 B1 | 12/2011 | Meyer et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |

(Continued)

*Primary Examiner* — Dennis M Butler

(57) ABSTRACT

Powering a data storage device (DSD) including at least a first storage tier and a second storage tier. A current used by the DSD is monitored and it is determined whether the current exceeds a current threshold. A throttle signal is asserted to reduce power used by the first storage tier when it is determined that the current exceeds the current threshold.

25 Claims, 5 Drawing Sheets

(56) References Cited

U.S. PATENT DOCUMENTS

| | | | |
|---|---|---|---|
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2004/0083396 A1 | 4/2004 | Perahia |
| 2010/0169690 A1* | 7/2010 | Mundada et al. ............ 713/340 |
| 2010/0174849 A1 | 7/2010 | Walston et al. |
| 2010/0235659 A1* | 9/2010 | Sawyers et al. ............... 713/320 |
| 2010/0250793 A1 | 9/2010 | Syu |
| 2010/0318824 A1 | 12/2010 | Tinker |
| 2011/0099323 A1 | 4/2011 | Syu |
| 2011/0202707 A1 | 8/2011 | Moon et al. |
| 2011/0283049 A1 | 11/2011 | Kang et al. |
| 2011/0320690 A1* | 12/2011 | Petersen et al. .............. 711/103 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2013/0294111 A1* | 11/2013 | Persson et al. .................. 363/16 |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2014/0325166 A1* | 10/2014 | Iyigun et al. .................. 711/158 |

* cited by examiner

AUTOMATIC PEAK CURRENT THROTTLE OF TIERED STORAGE ELEMENTS

BACKGROUND

Hybrid drives (SSHD) provide the benefits of both a hard disk drive (HDD) and a solid-state drive (SSD). The HDD and SSD subsystems of the SSHD run independently but share a common power supply for the SSHD. For example, hybrid UltraBook application typically have a HDD running on 5V and an SSD running of 3.3V, but the SSHD runs on a 5V for both subsystems. The combined currents for the HDD and SSD subsystems can exceed the host power supply capability.

BRIEF DESCRIPTIONS OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed, FIG. 1 illustrates a block diagram of a data storage device (DSD) according to one implementation of the present disclosure;

DETAILED DESCRIPTION

In the following detailed description, numerous specific details are set forth to provide a full understanding of the present disclosure. It will be apparent, however, to one of ordinary skill in the art that the various implementations disclosed may be practiced without some of these specific details. In other instances, well-known structures and techniques have not been shown in detail to avoid unnecessarily obscuring the various implementations.

Figure 1:
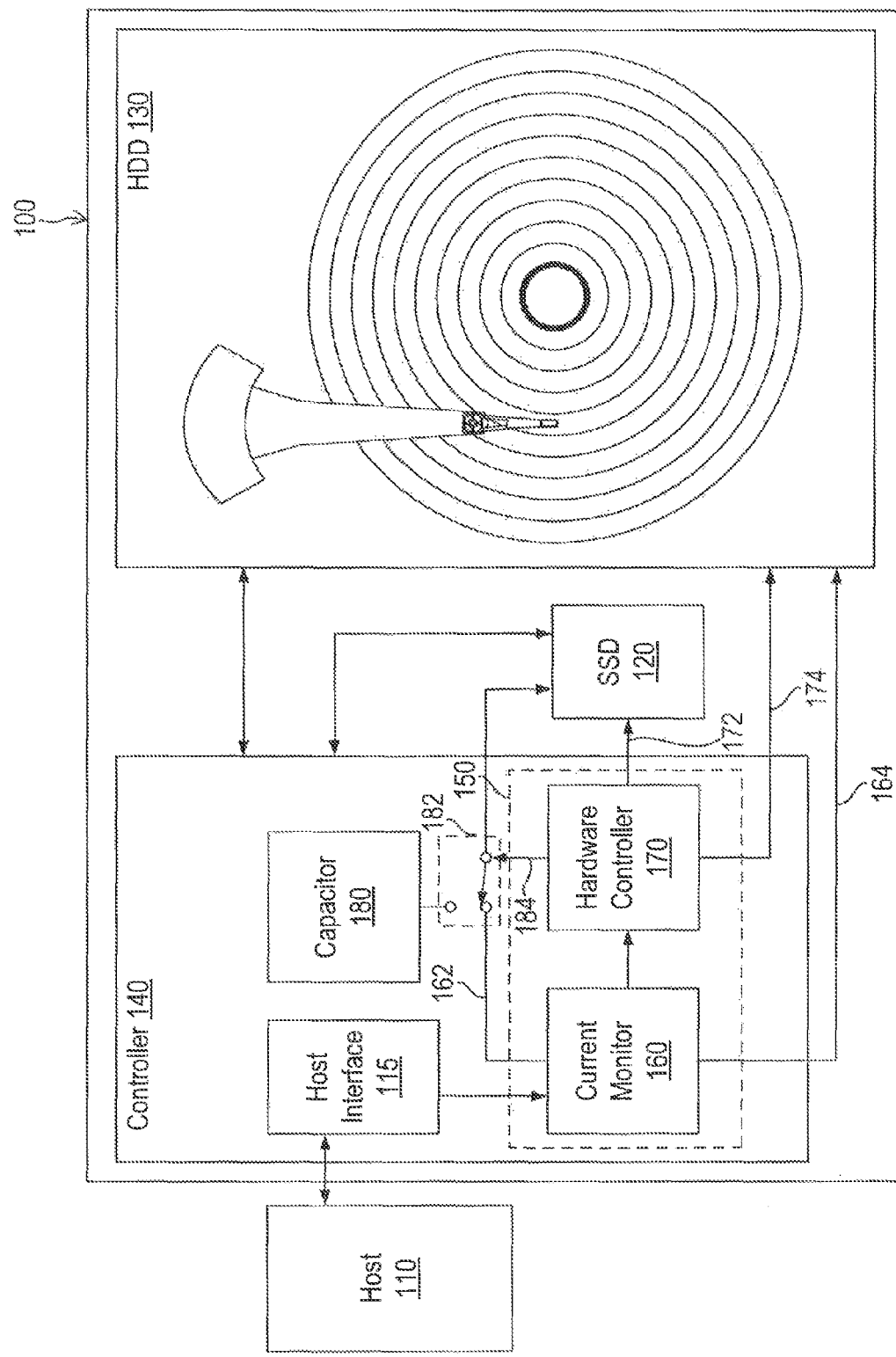

FIG. 1 illustrates a block diagram of a data storage device (DSD) 100 and a host 110. The host 110 is a computer system, such as a desktop, laptop, or mobile device, with which the DSD 100 interfaces. The DSD 100 may be an internal storage of the host 110, or may be external, i.e. housed within an external drive enclosure. The DSD 100 is a tiered storage device, having at least two storage tiers. In the implementation depicted in FIG. 1, the first storage tier is a solid state drive (SSD) 120 including a solid state memory for storing data. As shown in FIG. 1, the DSD 100 also includes as the second storage tier a hard disk drive (HDD) 130 which includes a rotational media for storing data. In other implementations, the DSD 100 may have additional storage tiers, and the first and/or second storage tiers may comprise alternative storage tiers.

The DSD 100 interfaces with the host 110 through a controller 140. The controller 140 is connected to the SSD 120 and the HOD 130 to control the SSD 120 and the HOD 130 through signals. The controller 140 further includes a host interface 115 and a throttle control circuit 150. The host 110 can provide power (i.e. a host supply) to the DSD 100 through the host interface 115. Various signals used for communication pass through the host interface 115 as well. The host interface 115 is connected to the throttle control circuit 150.

The throttle control circuit 150 includes a current monitor 160 and a hardware controller 170. A host supply current may be routed through the current monitor 160. An SSD current 162 provides power to the SSD 120, and an HDD current 164 provides power to the HDD 130. A switch 182, which is controlled by the hardware controller 170 through a switch signal 184, can switch the power supply of the SSD 120 from the host supply to a capacitor 180. The capacitor 180 may be a single capacitor or may be a capacitor farm as known in the art. The current monitor 160 monitors the current levels of the SSD current 162 and the HDD current 164. In certain implementations, the current monitor 160 may monitor just one storage tier, just the combined current, or separately monitor the currents of each storage tier.

The current monitor 160 communicates to the hardware controller 170. The hardware controller 170 can send an SSD throttle signal 172 to the SSD 120 to reduce power used by the SSD 120. In certain implementations, the hardware controller 170 can send an HOD throttle signal 174 to the HDD 130 instead of or in addition to the SSD throttle signal 172. The SSD 120 may respond to SSD throttle signal 172 being asserted by pausing execution of commands. Similarly, the HDD 130 may respond to the HDD throttle signal 174 being asserted by pausing execution of commands. The operation of the throttle control circuit 150 will be further discussed with respect to FIG. 2.

Figure 2:
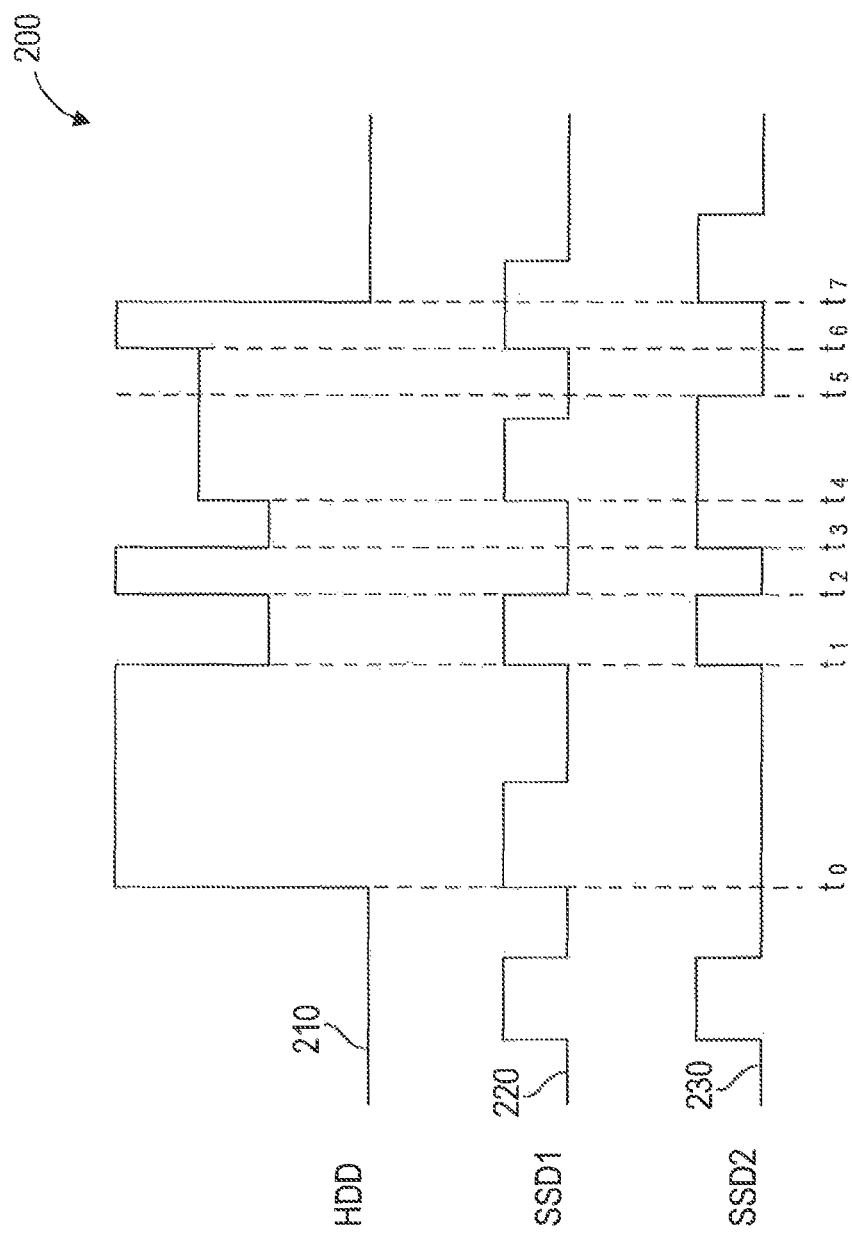
FIG. 2 illustrates exemplary current levels of a hard disk drive (HDD), a solid-state drive (SSD), and a throttled SSD.

FIG. 2 illustrates a graph 200 of exemplary current levels during operation of the DSD 100. An HDD current curve 210 may correspond to current measurements of the HDD current 164 over time during various HDD operations. An SSD current curve 220 may correspond to current measurements of the SSD current 162 over time during various SSD operations. A throttled SSD current curve 230 may correspond to current measurements of the SSD current 162 over time while being throttled by the throttle control circuit 150.

At time $t_0$, the HOD current curve 210 transitions from a low state to a high state. For example, the HDD current curve 210 may rise to 0.9 A at time $t_0$ to perform a power intensive operation, such as spinning up the disk. At time $t_1$, the HDD current curve 210 falls because, for instance, the power intensive operation is complete. At time $t_2$, the HDD current curve 210 rises again for a short period of time, such as for a seek operation. At time $t_3$, the operation is complete, and the HDD current curve 210 falls again. At time $t_4$, the HDD current curve 210 rises, but not as high as previously. For example, at $t_4$ the HDD may be performing a write and read operation. At time $t_6$, the operation may ramp up, and at time $t_7$, the operation is complete.

The SSD can operate independently from the HOD to perform operations simultaneously. The SSD draws its own current for operations. However, when both the HOD and the SSD perform operations simultaneously, the combined current drawn may exceed or approach a limit for the host supply. In such cases, the DSD can be managed by reducing power used by one of the storage tiers.

The SSD current curve 220 shows the current levels when the SSD1, an unthrottled SSD, operates independently from the HDD. At time $t_0$, while the HDD current curve 210 is high, the SSD current curve 220 is also high. The combined current at time $t_0$ exceeds a current threshold set for the DSD 100. In addition, at time $t_6$ the HDD current curve 210 and the SSD current curve 220 are both high. The SSD current curve 220 rises and falls independently from the HDD current curve 210, resulting in time spans in which both the HDD and the SSD1 are drawing peak current levels. In addition, certain time spans, such as from $t_3$ to $t_4$, have both the HDD current curve 210 and the SSD current curve 220 at low or idle levels.

To prevent the combined current from exceeding the current threshold, the throttle control circuit 150 may throttle the SSD current. As seen in the throttled SSD current curve 230, for the SSD2, a throttled SSD receiving the same commands as the SSD1, operations are paused from $t_0$ to $t_1$, when the HDD current curve 210 is high. The SSD2 resumes operations when the HDD current curve 210 drops at time $t_1$. The SSD2 may then perform the operation paused at time $t_0$, as seen in the throttled SSD current curve 230 at $t_1$. At time $t_2$, the SSD2 pauses operations to drop the current level until time $t_3$. At $t_3$, the HDD current curve 210 falls, which allows the SSD2 to resume operations without the combined current exceeding the current threshold. At time $t_4$, the SSD2 continues to run until the operation is complete. From time $t_4$ to time $t_5$ the SSD2 may run operations previously paused during throttling, because the HDD current curve 210 does not rise high enough for the combined current to exceed the current threshold. For example, at time $t_3$ the SSD2 may run the operation at time $t_1$ of the SSD current curve 220, because at time $t_1$ the SSD2 was performing the paused operation from time $t_0$. Instead of pausing between operations, the SSD2 may continue with its queued operations until completed, or until another throttle causes the SSD2 to pause operations. At time $t_6$ the SSD2 receives another command, but unlike the SSD1, the SSD2 waits until $t_7$, when the HDD current curve 210 has fallen. The throttling prevents the HDD current curve 210 and the throttled SSD current curve 230 from reaching peak currents simultaneously, thereby preventing the combined current from exceeding the current threshold.

Figure 3:
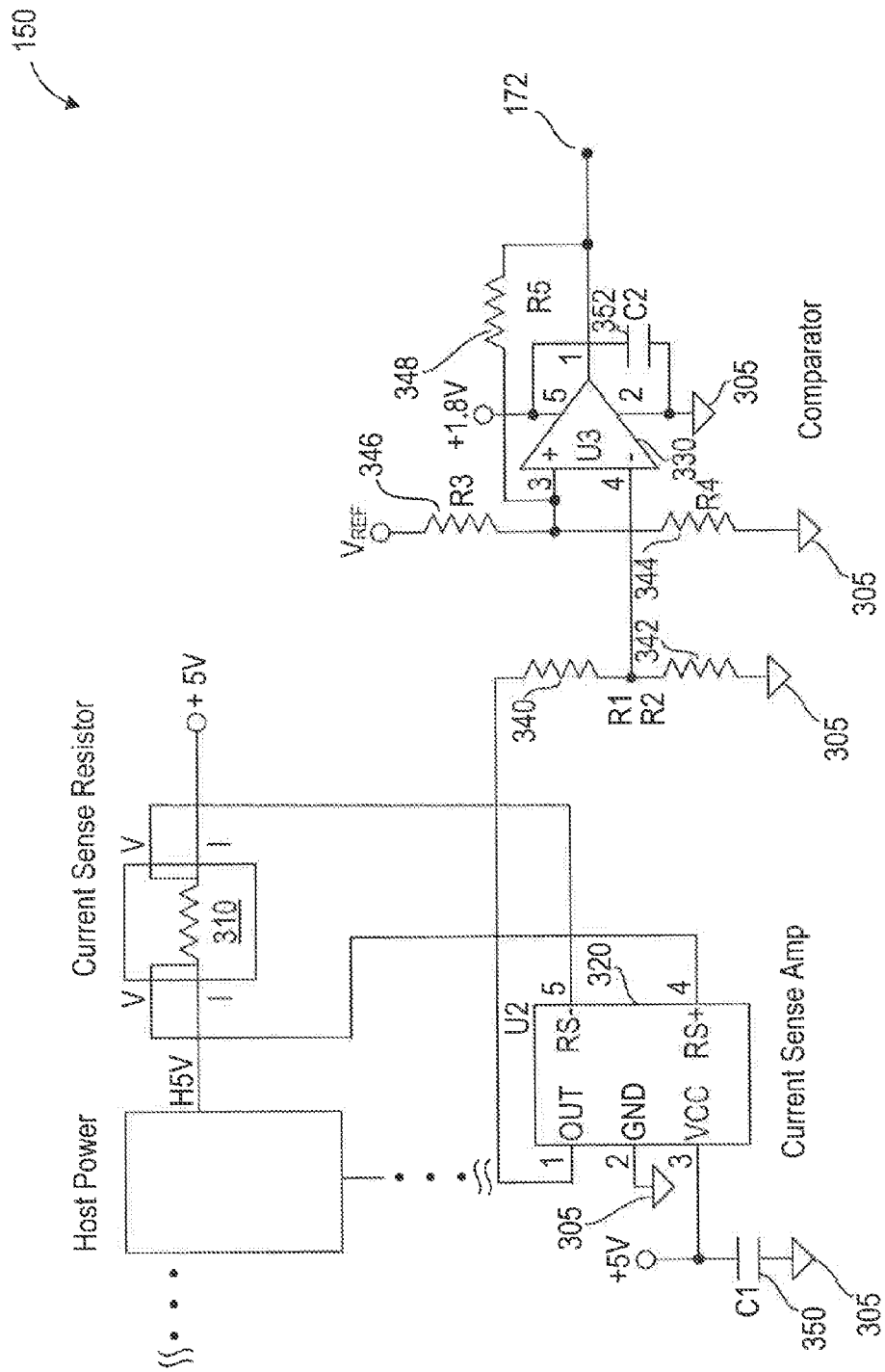
FIG. 3 illustrates a circuit diagram of a current throttling circuit according to one implementation of the present disclosure.

FIG. 3 presents a circuit diagram of one implementation of the throttle control circuit 150. The host power is routed through a current sense resistor 310. The current sense resistor 310 cooperates with a current sense amp 320 to measure a current used by the DSD 100. The current sense resistor 310 may be connected to a positive voltage, such as +5V. The current sense amp 320 is also connected to a positive voltage, as well as a ground 305 through a capacitor (C1) 350. In other implementations the voltages may be set at other appropriate values and the current sense resistor 310 and the current sense amp 320 may be alternatively configured. The current measured may be a current used by all the storage tiers, such as the combined current discussed with respect to FIG. 2, or may be a current used by one storage tier, such as a storage tier using the most power. In other implementations, the current is measured by other means, such as a current mirror, a Hall sensor, or a field-effect transistor (FET) configured to measure current.

The measured current is output to a comparator 330. The measured current may be connected to resistor (R1) 340 and resistor (R2) 342. In FIG. 3, the measured current is input to a negative terminal of the comparator 330, and a reference voltage, $V_{REF}$, is input to a positive terminal of the comparator 330. $V_{REF}$ may be connected to resistor (R3) 346 and resistor (R4) 344. $V_{REF}$ corresponds to the current threshold, which is compared to the measured current. The current threshold, i.e. $V_{REF}$, may be fixed through a resistor divider, or may be variable through a digital-to-analog converter (DAC) or otherwise programmable through a firmware of the DSD 100.

In FIG. 3, the comparator 330 may be an operational amplifier (op-amp) having its positive power supply pin connected to a positive voltage +1.8V, and its negative power supply pin connected to the ground 305. The power supply pins are further connected through capacitor (C2) 352. The comparator 330 outputs the SSD throttle signal 172. The comparator 330 outputs a high signal, asserting the throttle, when the measured current exceeds the current threshold. The output is also connected to the positive input through resistor (R5) 348 to provide a feedback. Other implementations may use different voltages or alternative circuits capable of comparing the measured current to the current threshold.

The current sense resistor 310 and the current sense amp 320 may generally correspond to the current monitor 160, and the comparator 330 may generally correspond to the hardware controller 170. In other implementations, the current monitor 160 and the hardware controller 170 may be implemented through various circuits, sub-circuits, and components, and may not be two discrete components or circuits.

Although not shown in FIG. 3, the throttle control circuit 150 may further include additional circuitry to improve the effectiveness of the throttling. The circuitry may help predict a profile of the measured current over time. For instance, the throttle control circuit 150 may have circuitry to perform hysteresis on the measured current. The firmware may monitor a rate of change in the measured current, or a duration above various current levels, in order to determine a current threshold. For example, if the current's rate of change is slow, the current threshold may be set higher, as there would be less risk of reaching a maximum allowed peak current. A fast rate of change may correspond to the throttle control circuit 150 determining a lower current threshold. However, in certain implementations, the use of firmware may be reduced in order to reduce complexity and to speed up operation.

In one embodiment, the throttle signal may be connected to a pulse stretching circuit in order to assert the throttle signal for at least a minimum duration. The minimum duration may be selected to ensure enough time for the throttling to take effect. In addition, the minimum duration may prevent the throttle signal from being rapidly asserted and de-asserted when the measured current fluctuates near the current threshold.

Figure 4:
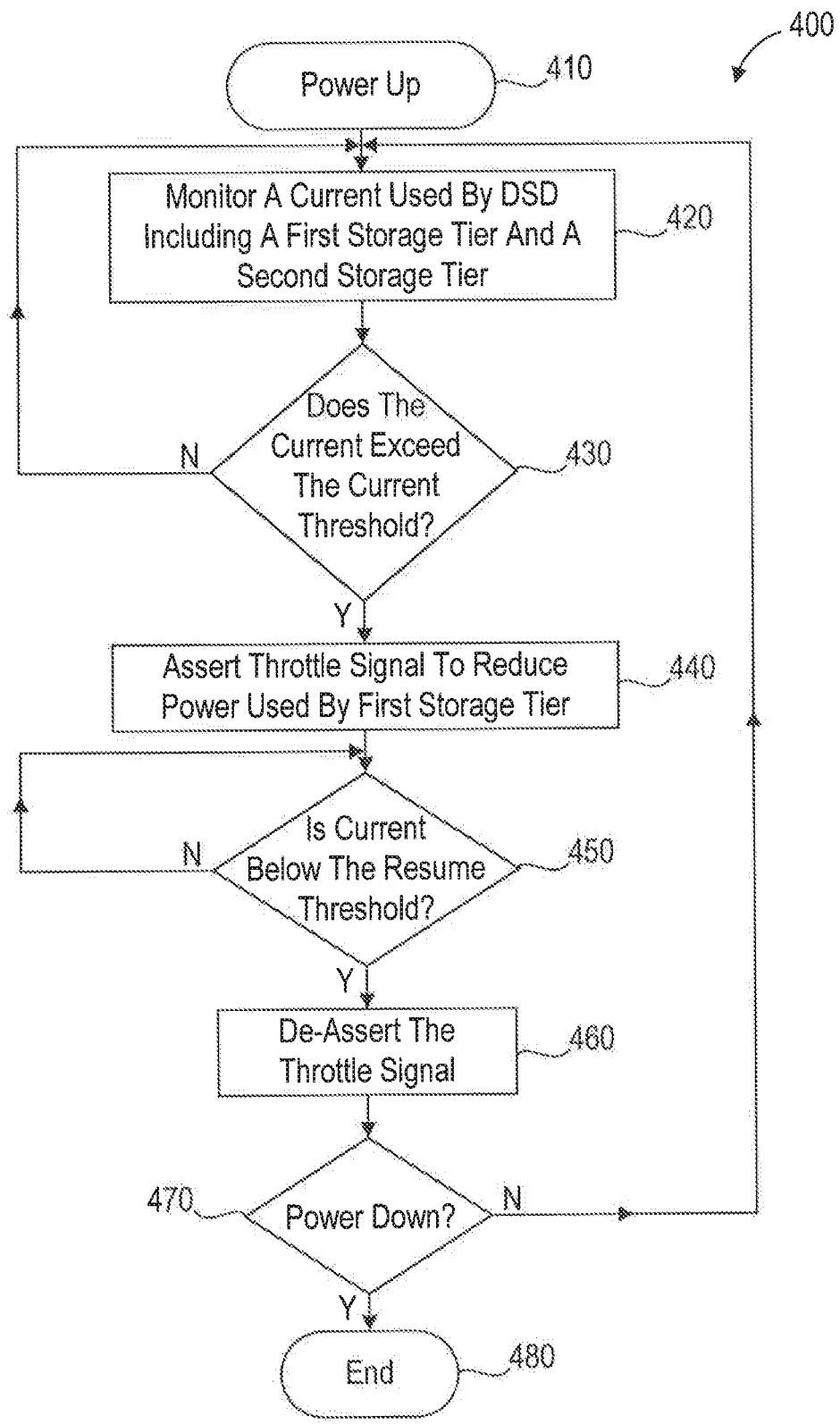
FIG. 4 depicts a flowchart of a current throttling process according to one implementation of the present disclosure.

FIG. 4 presents a flowchart 400 depicting one implementation of the present disclosure. At 410, the host 110 and the DSD 100 are powered up. At 420, the throttle control circuit 150, specifically, the current monitor 160, monitors a current used by the DSD 100. At 430, the throttle control circuit 150 determines whether the current exceeds the current threshold. If the current does not exceed the current threshold, the process returns to 420 to continue monitoring the current.

Otherwise, the process continues to 440. At 440, the throttle control circuit 150 asserts a throttle signal to reduce power used by a first storage tier. The SSD 120 may be the first storage tier, which is chosen to be throttled because there is less impact on the system. In this regard, the SSD 120 is easier to start and stop compared to the HDD 130, and has no moving parts to consider. Certain DSDs 100 may have an SSD 120 that further includes a pin or other means to receive the SSD throttle signal 172. However, in other implementations, the HDD 130 may be throttled instead of or in addition to the SSD 120. The HDD 130 may also include an interface such as a pin to receive the HDD throttle signal 174. In addition, the SSD throttle signal 172 may be the same as the HDD throttle signal 174 such that both storage tiers may be throttled with one signal.

At 450, the throttle control circuit 150 determines if the current is below a resume threshold. The resume threshold ensures that the current is sufficiently below the current threshold before de-asserting the throttle signal. Similar to the current threshold, the resume threshold may be fixed or may be variable, selected through hysteresis and other analysis to improve the effectiveness of the throttling.

When the current is below the resume threshold, the throttle signal is de-asserted at 460. At 470, if the host 110 is powered down, the process ends at 480. Otherwise, the process returns to 420.

Figure 5:
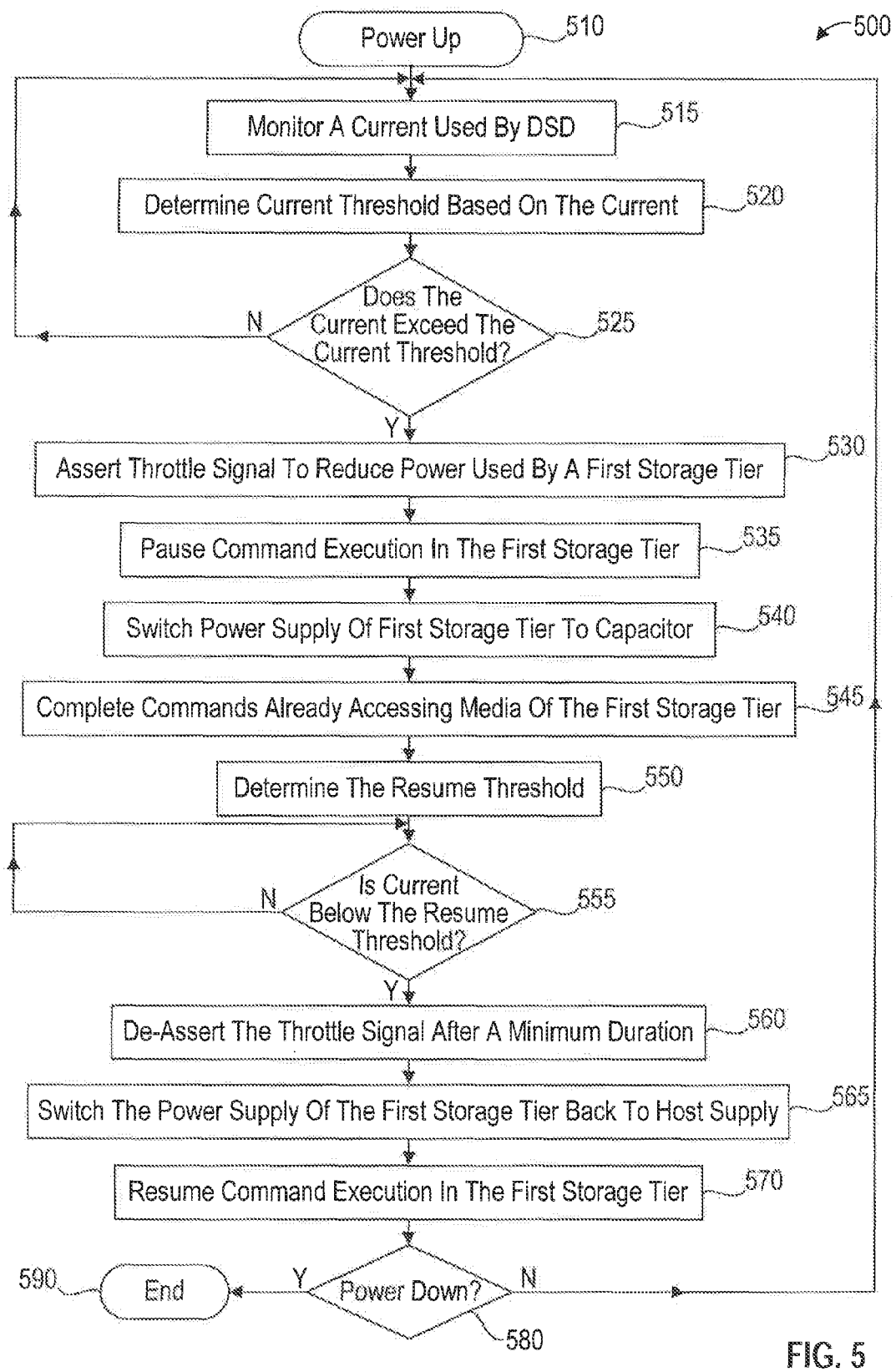
FIG. 5 depicts a flowchart of a current throttling process according to another implementation of the present disclosure.

FIG. 5 presents a flowchart 500 of another implementation of the present disclosure. After the host 110 is powered up at 510, the throttle control circuit 150 monitors a current used by the DSD 100 at 515.

At 520, the throttle control circuit 150 determines a current threshold based on the current. The determined current threshold may vary depending upon factors which may indicate whether the monitored current is likely to reach the current threshold. For instance, the current's rate of change may be used to determine the current threshold. In such an example, a relatively fast increase in the monitored current can result in a lower current threshold to reduce the likelihood of exceeding a power supply limit for the DSD 100. In another example, a current level can be set below the current threshold. When the monitored current exceeds the current level for more than a predetermined duration, the current threshold may be lowered to reduce the likelihood of exceeding the power supply limit for the DSD 100. Additionally, hysteresis may be used to determine an appropriate current threshold. At 525, the throttle control circuit 150 determines whether the current exceeds the current threshold.

If the current exceeds the current threshold, then at 530 the throttle control circuit 150 asserts a throttle signal to reduce power used by a first storage tier. If the SSD 120 is the storage tier to be throttled, then the throttle control circuit 150 asserts the SSD throttle signal 172. In other implementations, the throttle control circuit 150 may instead assert the HDD throttle signal 174. In certain other implementations, the throttle control circuit 150 may decide between which of the SSD 120 and the HDD 130 to throttle. In other implementations, the throttle control circuit 150 may send a throttle signal to all storage tiers, at least one of which configured to accept and respond to the throttle signal.

In response to the SSD throttle signal 172, the SSD 120 pauses command execution at 535. The SSD throttle signal 172 causes the SSD 120 to stop executing commands after the SSD throttle signal 172 was asserted. By pausing command execution, the SSD 120 uses reduced power.

The SSD 120 may have commands queued or still being executed when the SSD throttle signal 172 is asserted. Pausing command execution in the middle of a command being executed may result in errors. In particular, commands accessing media (e.g. solid state memory or rotational media) may not be safely paused. Accordingly, such commands may run to completion to avoid errors. However, if commands are being executed after the throttle signal is asserted, then the power usage may not be reduced.

To reduce power drawn from the host 110 while allowing completions of commands already accessing media of the SSD 120, the SSD 120 may be powered by an alternative supply. As seen in FIG. 1, the DSD 100 further includes a capacitor 180. The capacitor 180 may be a capacitor or a capacitor farm configured to provide power to the SSD 120. The capacitor 180 is coupled to the SSD 120 through a switch 182. The switch 182 switches the power supply of the SSD 120 from the host supply or the capacitor 180.

At 540, the power supply of the SSD 120 is switched to the capacitor 180. The switch 182 is controlled by the throttle control circuit 150, specifically the hardware controller 170, through the switch signal 184. The switch signal 184 may be the same as the throttle signal such that when the throttle signal is asserted, the switch 182 switches to the capacitor 180, and when the throttle signal is de-asserted, the switch 182 switches back to the host supply, i.e. the SSD current 162. In other implementations, the switch signal 184 may be another signal. When the HDD 130 is the storage tier to be throttled, the capacitor 180 and the switch 182 may instead be connected to the HDD 130.

At 545, the SSD 120 completes commands already accessing a media (i.e. NAND gates) of the SSD 120. Because the SSD 120 completes the commands while powered by the capacitor 180, the power drawn from the host 110 is reduced. Further, when the commands are completed, the SSD 120 no longer executes any commands.

At 550, a resume threshold is determined. The resume threshold may be determined through a hysteresis of the current, or may be a fixed value. The process waits at 555 until the current is below the resume threshold. When the current is below the resume threshold, the throttle signal is de-asserted after a minimum duration at 560. The minimum duration ordinarily prevents fluctuations in the current from causing the throttle signal to rapidly cycle between assertion and de-assertion. The minimum duration also ensures that the command execution is paused long enough to effectuate a reduction of power consumption.

At 565, the power supply of the SSD 120 is switched back to the host supply. When the switch signal 184 is the same as the throttle signal, the switching may occur nearly simultaneously as the de-assertion of the throttle signal. In other implementations, the switching may occur immediately after the commands previously received are complete. In yet other implementations, the switching may occur at other appropriate times. In addition, the switching may allow the capacitor 180 to recharge for the next throttle operation.

At 570, the SSD 120 resumes command execution normally. The commands queued while the throttle signal was asserted can resume execution in the same order as queued. In certain implementations, the commands may be executed in a different order, to improve efficiency as needed. At 580, if the host 110 is powered down, the process ends at 590. Otherwise, the throttle control circuit 150 continues monitoring the current at 515.

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes a processor or computer to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, and controllers described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The activities of a method or process described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example implementations is provided to enable any person of ordinary skill in the art to make or use the implementations in the present disclosure. Various modifications to these examples will be readily apparent to those of ordinary skill in the art, and the principles disclosed herein may be applied to other examples without departing from the spirit or scope of the present disclosure. The described implementations are to be considered in all respects only as illustrative and not restrictive and the scope of the disclosure is, therefore, indicated by the following claims rather than by the foregoing description. All changes which come within the meaning and range of equivalency of the claims are to be embraced within their scope.

According to one implementation, a method is disclosed for powering a DSD including at least a first storage tier and a second storage tier. The method comprises monitoring a current used by the DSD, determining whether the current exceeds a current threshold, and asserting a throttle signal to reduce power used by the first storage tier when it is determined that the current exceeds the current threshold.

According to another implementation, a DSD is disclosed, comprising a first storage tier, a second storage tier, and circuitry configured to monitor a current used by the DSD, determine whether the current exceeds a current threshold, and assert a throttle signal to reduce power used by the first storage tier when it is determined that the current exceeds the current threshold.

What is claimed is:

1. A method for powering a data storage device (DSD) including at least a first storage tier and a second storage tier, the method comprising:
   monitoring a current used by the DSD;
   determining a current threshold based on at least one of a rate of change of the monitored current and a duration for which the monitored current is above a predetermined level;
   determining whether the current exceeds the current threshold; and
   asserting a throttle signal to reduce power used by the first storage tier when it is determined that the current exceeds the current threshold.

2. The method of claim 1, wherein the first storage tier comprises a solid state memory and the second storage tier comprises a rotational media.

3. The method of claim 1, further comprising pausing command execution in the first storage tier in response to the throttle signal being asserted to reduce power used by the first storage tier.

4. The method of claim 3, further comprising completing execution of at least one command already accessing a media of the first storage tier.

5. The method of claim 4, wherein a capacitor of the DSD provides power to complete execution of the at least one command already accessing the media of the first storage tier.

6. The method of claim 1, further comprising:
   when the throttle signal is asserted, determining whether the current is a below a resume threshold; and
   de-asserting the throttle signal when it is determined that the current is below the resume threshold.

7. The method of claim 6, wherein de-assertion of the throttle signal occurs after a minimum duration.

8. The method of claim 6, wherein the resume threshold is based on a hysteresis of the current.

9. The method of claim 1, wherein the first storage tier is a hard disk drive (HDD) and the second storage tier is a solid state drive (SSD), and further comprising pausing HDD operations in response to the throttle signal being asserted to reduce power used by the first storage tier.

10. A data storage device (DSD) comprising:
    a first storage tier;
    a second storage tier; and
    circuitry configured to:
      monitor a current used by the DSD;
      determine a current threshold based on at least one of a rate of change of the monitored current and a duration for which the monitored current is above a predetermined level;
      determine whether the current exceeds the current threshold; and
      assert a throttle signal to reduce power used by the first storage tier when it is determined that the current exceeds the current threshold.

11. The DSD of claim 10, wherein the circuitry includes a current sense resistor and a current sense amplifier for monitoring the current used by the DSD.

12. The DSD of claim 10, wherein the circuitry includes a field-effect transistor (FET) for monitoring the current used by the DSD.

13. The DSD of claim 10, wherein the circuitry includes a comparator for determining whether the current exceeds the current threshold and asserting the throttle signal.

14. The DSD of claim 10, wherein the circuitry includes a reference defining the current threshold.

15. The DSD of claim 10, wherein the reference is a fixed reference determined by a resistor divider.

16. The DSD of claim 14, wherein the reference is a variable reference determined by a digital-to-analog converter (DAC).

17. The DSD of claim 10, wherein the first storage tier comprises a solid state memory and the second storage tier comprises a rotational media.

18. The DSD of claim 10, wherein the first storage tier pauses command execution in response to the throttle signal being asserted to reduce power used by the first storage tier.

19. The DSD of claim 18, wherein the first storage tier completes execution of at least one command already accessing a media of the first storage tier.

20. The DSD of claim 19, further comprising a capacitor configured to provide power to the first storage tier to complete execution of the at least one command already accessing the media of the first storage tier.

21. The DSD of claim 10, wherein the circuitry determines whether the current is a below a resume threshold when the throttle signal is asserted and de-asserts the throttle signal when the current is below the resume threshold.

22. The DSD of claim 21, wherein the circuitry de-asserts the throttle signal after a minimum duration.

23. The DSD of claim 22, wherein the circuitry further includes a pulse stretching circuit configured to keep the throttle asserted for the minimum duration.

24. The DSD of claim 21, wherein the resume threshold is based on a hysteresis of the current.

25. The DSD of claim 10, wherein the first storage tier is a hard disk drive (HDD) and the second storage tier is a solid state drive (SSD), and wherein the HDD pauses HDD operations in response to the throttle signal being asserted to reduce power used by the first storage tier.

* * * * *